(12) United States Patent
Miyoshi et al.

(10) Patent No.: US 9,171,914 B2
(45) Date of Patent: Oct. 27, 2015

(54) SEMICONDUCTOR DEVICE

(71) Applicant: NGK Insulators, Ltd., Nagoya (JP)

(72) Inventors: Makoto Miyoshi, Inazawa (JP);
Yoshitaka Kuraoka, Anjo (JP)

(73) Assignee: NGK Insulators, Ltd., Nagoya (JP)

( * ) Notice: Subject to any disclaimer, the term of this patent is extended or adjusted under 35 U.S.C. 154(b) by 83 days.

(21) Appl. No.: 13/713,318

(22) Filed: Dec. 13, 2012

(65) Prior Publication Data

US 2013/0119437 A1 May 16, 2013

Related U.S. Application Data

(62) Division of application No. 11/685,941, filed on Mar. 14, 2007, now abandoned.

(30) Foreign Application Priority Data

Mar. 15, 2006 (JP) .................................. 2006-070464

(51) Int. Cl.
*H01L 29/267* (2006.01)
*H01L 29/861* (2006.01)
(Continued)

(52) U.S. Cl.
CPC ............ *H01L 29/267* (2013.01); *H01L 29/861* (2013.01); *H01L 29/872* (2013.01); *H01L 29/2003* (2013.01)

(58) Field of Classification Search
CPC ... H01L 29/861; H01L 29/872; H01L 29/267; H01L 29/2003
See application file for complete search history.

(56) References Cited

U.S. PATENT DOCUMENTS

| 3,852,796 A | 12/1974 | Cuomo et al. |
| 4,001,762 A | 1/1977 | Aoki et al. |
| 4,899,199 A | 2/1990 | Gould |

(Continued)

FOREIGN PATENT DOCUMENTS

| EP | 0 580 213 A1 | 1/1994 |
| JP | 61-135158 A1 | 6/1986 |

(Continued)

OTHER PUBLICATIONS

R. Raghunathan and B. J. Baliga, "P-type 4H and 6H-SiC High-Voltage Schottky Barrier Diodes," IEEE Electron Device Letters, vol. 19, No. 3, Mar. 1998, pp. 71-73.

(Continued)

*Primary Examiner* — Hrayr A Sayadian
(74) *Attorney, Agent, or Firm* — Burr & Brown, PLLC

(57) ABSTRACT

A semiconductor device having small leakage current and high breakdown voltage during reverse blocking, small on-state resistance and large output current at forward conduction, short reverse recovery time at shutoff, and high peak surge current value is provided. An n-type layer is made of a group-III nitride, and a p-type layer is made of a group-IV semiconductor material having a smaller band gap than the group-III nitride. The energy level at the top of the valence band of the n-type layer is lower than the energy level at the top of the valence band of the p-type layer, so that a P-N junction semiconductor device satisfying the above requirements is obtained. Further, a combined structure of P-N junction and Schottky junction by additionally providing an anode electrode to be in Schottky contact with the n-type layer also achieves the effect of decreasing voltage at the rising edge of current resulting from the Schottky junction.

6 Claims, 6 Drawing Sheets

(51) Int. Cl.
*H01L 29/872* (2006.01)
*H01L 29/20* (2006.01)

(56) References Cited

U.S. PATENT DOCUMENTS

| | | | |
|---|---|---|---|
| 4,982,260 A | 1/1991 | Chang et al. | |
| 5,061,972 A | 10/1991 | Edmond | |
| 5,408,120 A * | 4/1995 | Manabe et al. | 257/431 |
| 5,701,321 A | 12/1997 | Hayafuji et al. | |
| 5,753,938 A | 5/1998 | Thapar et al. | |
| 5,804,868 A | 9/1998 | Kobayashi et al. | |
| 5,821,555 A * | 10/1998 | Saito et al. | 257/13 |
| 5,898,185 A | 4/1999 | Bojarczuk et al. | |
| 6,233,265 B1 | 5/2001 | Bour et al. | |
| 6,306,211 B1 | 10/2001 | Takahashi et al. | |
| 2002/0015866 A1 | 2/2002 | Hooper et al. | |
| 2003/0064535 A1 | 4/2003 | Kub et al. | |
| 2003/0160264 A1 | 8/2003 | Yagi et al. | |
| 2005/0045892 A1 * | 3/2005 | Hayashi et al. | 257/77 |
| 2005/0062392 A1 | 3/2005 | Sakai et al. | |
| 2006/0243988 A1 | 11/2006 | Narukawa et al. | |
| 2007/0018184 A1 * | 1/2007 | Beeson et al. | 257/98 |
| 2007/0096239 A1 | 5/2007 | Cao et al. | |
| 2012/0319071 A1 * | 12/2012 | Awaya et al. | 257/4 |

FOREIGN PATENT DOCUMENTS

| | | | |
|---|---|---|---|
| JP | 04-502536 A1 | 5/1992 | |
| JP | 06-097469 A1 | 4/1994 | |
| JP | 2001-237434 A1 | 8/2001 | |
| JP | 2002-026341 A1 | 1/2002 | |
| JP | 2003-249642 A1 | 9/2003 | |
| JP | 2003-264154 A1 | 9/2003 | |
| JP | 2005-051096 A1 | 2/2005 | |
| JP | 2005-259797 | 9/2005 | |
| JP | 2007-250720 * | 9/2007 | H01L 29/861 |
| JP | 2007-250720 A1 | 9/2007 | |

OTHER PUBLICATIONS

Simon M. Sze and Kwok K. Ng, "Physics of Semiconductor Device," Nov. 3, 2006, pp. 22-23.

Michael Shur, *Introduction to Electronic Devices*, Ch. 3, Sec. 3.4, "*Intrinsic, Doped, and Compensated Semiconductors*,"1996, pp. 127-136, 543 and 553.

* cited by examiner

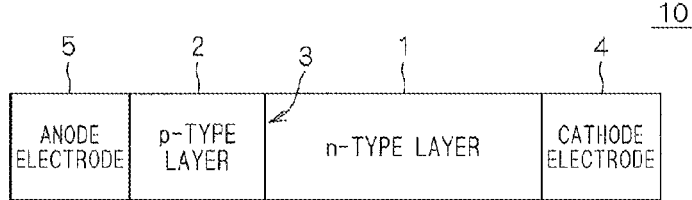
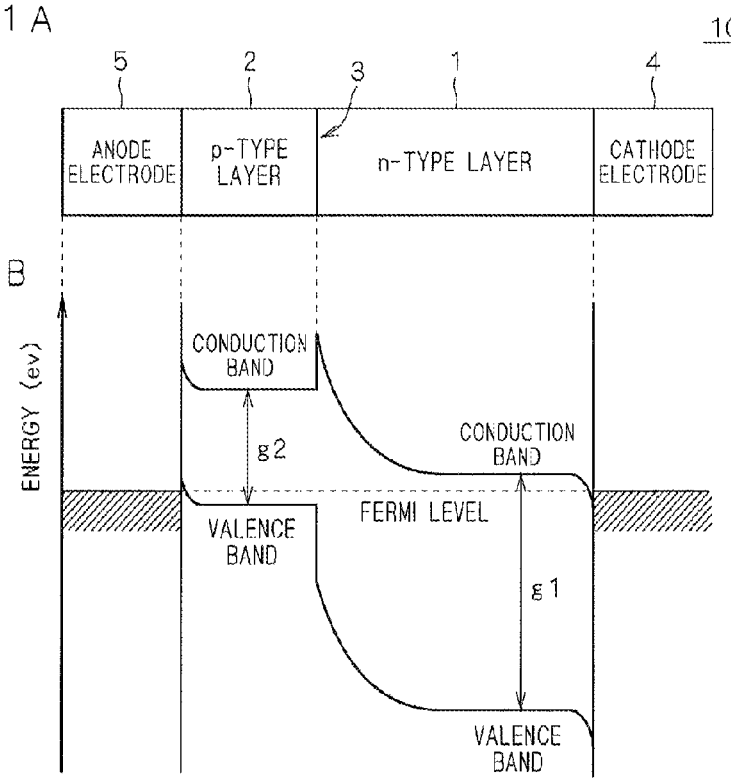

F I G . 4 A
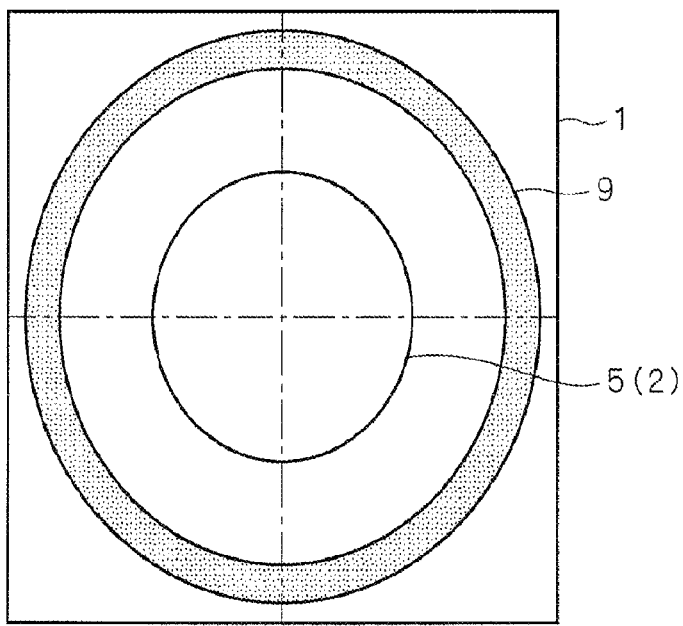
F I G . 4 B
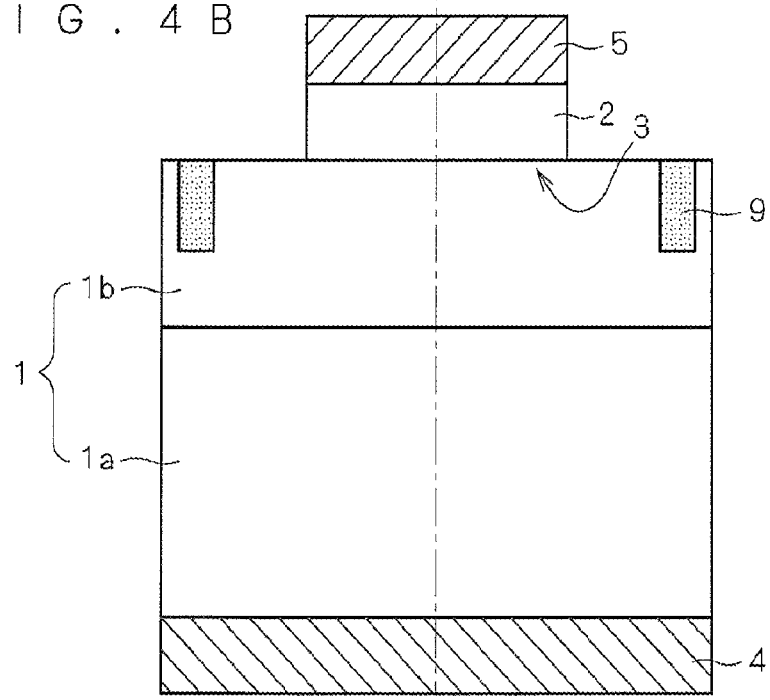

F I G. 5A
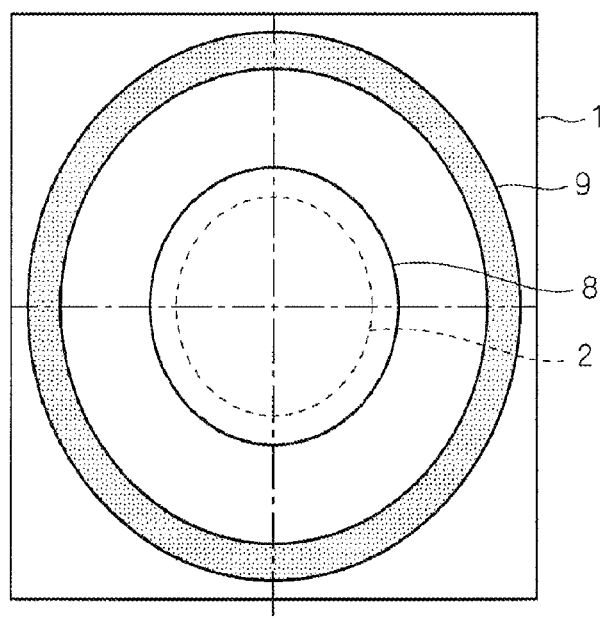
F I G. 5B
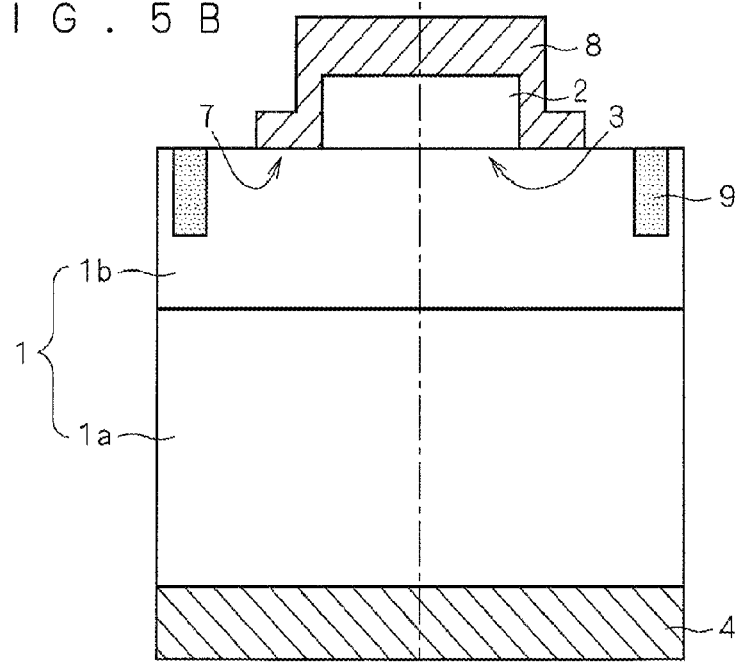

FIG. 7

| | FIRST EXAMPLE | SECOND EXAMPLE | COMPARATIVE EXAMPLE |
|---|---|---|---|
| REVERSE LEAKAGE CURRENT (nA) (AT 100V) | < 1 | < 1 | 200 |
| REVERSE BLOCKING BREAKDOWN VOLTAGE (V) | 1200 | 1120 | 500 |
| OUTPUT CURRENT (A) | 60 | 60 | 30 |
| REVERSE RECOVERY TIME (ns) | 0 | 0 | 0 |
| PEAK SURGE CURRENT (A) | 450 | 400 | 60 |
| ON-STATE VOLTAGE (V) AT FORWARD CURRENT OF 20A | 2.1 | 3.1 | 6.2 |
| ON-STATE VOLTAGE (V) AT FORWARD CURRENT OF 1A | 1.6 | 1.2 | 1.2 |

SEMICONDUCTOR DEVICE

CROSS REFERENCE TO RELATED APPLICATION

This application is a division of U.S. application Ser. No. 11/685,941, filed Mar. 14, 2007, and claims the benefit under 35 USC §119(a)-(d) of Japanese Application No. 2006-070464, filed Mar. 15, 2006, the entireties of which are incorporated herein by reference.

FIELD OF THE INVENTION

The present invention relates to a semiconductor device for power application, and more particularly to a power inverter or converter circuit device.

BACKGROUND OF THE INVENTION

A semiconductor-employed switching device (transistor, thyristor, etc.) or rectifier device (diode) is widely used as a power inverter or converter circuit device. Under the present circumstances, a more compact device with lower losses is preferable for such semiconductor device for power application in order to meet future demands for higher power. While silicon has conventionally been used widely as a semiconductor material, wide band gap semiconductor materials having higher breakdown fields are being developed as next-generation semiconductor materials in light of the present circumstances. Since what is called wide band gap semiconductor materials such as SiC, group-III nitride semiconductor, etc. are expected to have low on-state resistance and high breakdown voltage for their material properties, significant size reduction and reduction in losses of a power controller are expected by constituting a semiconductor device for power application using these materials.

Requirements on properties for such power diode include: (1) small leakage current during reverse blocking; (2) high breakdown voltage during reverse blocking; (3) large output current at forward conduction; (4) short reverse recovery time at shutoff; (5) high peak surge current value; and the like. Off course, a diode made of a wide band gap semiconductor material is required to meet these requirements.

Conventionally practical, silicon-employed P-N junction diode and its modified P-i-N junction diode have a drawback of long reverse recovery time at shutoff because of the occurrence of carrier injection from both P and N sides, that is, the above requirement (4) is not satisfied.

On the other hand, a silicon-employed Schottky barrier junction diode is also in practical use. This diode has an advantage in that a reverse current at shutoff does not occur in principle, but has drawbacks of having large leakage current and low breakdown voltage at application of a reverse-bias voltage and low peak surge current. That is, the above requirements (1), (2) and (5) are not satisfied.

To improve the drawbacks of such silicon-employed diodes, a SiC-employed Schottky barrier diode has been developed and is publicly known (cf. "P-Type 4H and 6H-SiC High Voltage Schottky Barrier Diodes" R. Raghunathan and B. J. Baliga, IEEE ELECTRON DEVICE LETTERS, Vol. 19, pp. 71-73 (1998)).

A SiC-employed Schottky barrier diode as disclosed in the above paper achieves the effect of increasing the breakdown voltage unlike a silicon-employed one, however, the drawbacks of not meeting the requirements (1) and (5) have not been solved so far.

SiC single crystal includes many crystal defects (specifically, tubular voids, what is called micropipes) and thus disadvantageously makes it difficult to manufacture with stability a device of relatively large area that can ensure sufficient output current, resulting in poor yields in manufacturing process.

Further, since a P-N junction diode employing SiC causes carrier recombination resulting from such crystal defects, the output current is more likely to be limited, so that the above requirement (3) is not satisfied.

A Schottky barrier diode employing group-III nitride semiconductor instead of silicon or SiC has also difficulty in solving the aforementioned drawbacks of not meeting the requirements (1) and (5).

Further, manufacturing a P-N junction diode having p- and n-type layers made of group-III nitride semiconductor instead of silicon or SiC is not practical because of technical difficulty in manufacturing P-type group-III nitride semiconductor having a high hole density with stability.

SUMMARY OF THE INVENTION

The present invention relates to a semiconductor device for power application, and more particularly to a power inverter or converter circuit device.

According to the invention, the semiconductor device comprises: a first semiconductor layer having a first conductivity type; a second semiconductor layer joined to the first semiconductor layer at a first junction, the semiconductor layer having a second conductivity type different from the first conductivity type; a first electrode joined to the first semiconductor layer; and a second electrode joined to the second semiconductor layer. The first semiconductor layer is made of a group-III nitride having a composition of $Al_{1-x-y}Ga_xIn_yN$ ($x \geq 0$, $y \geq 0$, $0 \leq x+y \leq 1$). The second semiconductor layer is made of a group-IV semiconductor material having a smaller band gap than the group-III nitride.

This achieves a heterojunction semiconductor device having a small leakage current and a high breakdown voltage during reverse blocking, and a high peak surge current value.

Preferably, in the semiconductor device according to the invention, the first conductivity type is an n-type, the second conductivity type is a p-type, the first electrode is a cathode electrode, the second electrode is an anode electrode, and an energy level at a top of a valence band of the first semiconductor layer is lower than an energy level at a top of a valence band of the second semiconductor layer in the vicinity of the first junction.

This achieves a P-N junction semiconductor device having a small leakage current and a high breakdown voltage during reverse blocking, a large output current at forward conduction, a short reverse recovery time at shutoff, and a high peak surge current value.

More preferably, the semiconductor device according to the invention further comprises a third electrode joined to the first semiconductor layer at a second junction, the third electrode having a Schottky contact property to the first semiconductor layer. The second electrode and the third electrode are connected in parallel, and the third electrode serves as an anode electrode.

This achieves a semiconductor device having more improved properties producing the effects of the P-N junction semiconductor device as well as the effects resulting from the Schottky junction.

It is therefore an object of the present invention to provide a semiconductor device suitable for power application.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are diagrams for explaining the structure of a semiconductor device according to a first preferred embodiment;

FIGS. 4A and 4B are diagrams schematically showing the structure of a vertical diode according to a first example;

FIGS. 5A and 5B are diagrams schematically showing the structure of a vertical diode according to a second example;

FIG. 7 is a table listing measurements obtained in the examples and comparative example.

DETAILED DESCRIPTION OF THE INVENTION

First Preferred Embodiment

Figure 2:
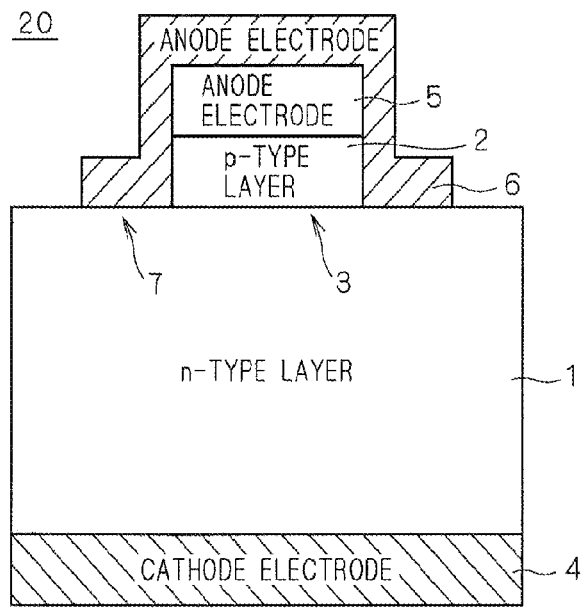
FIG. 2 is a sectional view schematically showing the structure of a semiconductor device according to a second preferred embodiment.

FIGS. 1A and 1B are diagrams for explaining the structure of a semiconductor device 10 according to a first preferred embodiment of the present invention. FIG. 1A schematically shows a sectional structure of the semiconductor device 10, and FIG. 1B shows the energy level of each layer constituting the semiconductor device 10. Each part in the respective drawings including FIGS. 1A and 1B is not always drawn at practical ratio. The structure of the semiconductor device 10 shown in FIG. 1A corresponds to the fundamental structure (conceptual structure) of various semiconductor devices by which the effects of the present invention can be achieved.

In the semiconductor device 10, an n-type layer 1 which is an n-type semiconductor layer and a p-type layer 2 which is a p-type semiconductor layer are joined at a junction 3, and a cathode electrode (cathode) 4 and an anode electrode (anode) 5 are provided next to the n-type layer 1 and p-type layer 2, respectively. In other words, the semiconductor device 10 is a P-N junction semiconductor device having what is called a diode structure. Accordingly, the semiconductor device 10 achieves high peak surge current value which is difficult to achieve in the case of Schottky junction semiconductor device on its principle.

In the present embodiment, as shown in FIG. 1B, the semiconductor device 10 is constructed such that a band gap g1 of a material of the n-type layer 1 is larger than a band gap g2 of material of the p-type layer 2. With such structure, only electrons move at forward conduction from the n-type layer 1 having a larger band gap to the p-type layer 2 having a smaller band gap, so that a reverse current does not flow in principle even when conduction is shut off. That is, the semiconductor device 10 has the property of very short reverse recovery time. Further, in the case of Schottky junction semiconductor device, free electrons exist in Schottky metal at high densities, causing electrons to move from the Schottky metal side to semiconductor layer side tunneling a depletion region during reverse blocking, which results in increase in reverse leakage current. In contrast, in the semiconductor device constructed as shown in FIG. 1B, electrons included in the p-type layer 2 exist at extremely small densities, which achieves the effect of significantly reducing reverse leakage current following the aforementioned phenomenon.

To meet the aforementioned requirements about band gaps, the n-type layer 1 is formed by doping a predetermined n-type dopant into a group-III nitride having a composition of $Al_{1-x-y}Ga_xIn_yN$ ($x \geq 0$, $y \geq 0$, $0 \leq x+y \leq 1$). The n-type dopant may be Si. The group-III nitride may be GaN. Such n-type layer 1 may be group-III nitride single crystal having a thickness of about several microns to several hundreds of microns manufactured by a predetermined technique such as MOCVD or HVPE.

Forming a layer having a larger bang gap in the P-N junction using a group-III nitride having a composition of $Al_{1-x-y}Ga_xIn_yN$ ($x \geq 0$, $y \geq 0$, $0 \leq x+y \leq 1$) achieves a high breakdown voltage.

Further, since such group-III nitride is a material capable of controlling conduction with carriers activated at a high rate, forming the n-type layer which is a semiconductor layer dominating conduction at reverse and forward conduction using a group-III nitride achieves the semiconductor device 10 with excellent properties.

The p-type layer 2 is formed by doping a predetermined p-type dopant, namely, an acceptor element into a group-IV semiconductor material having a smaller band gap than the group-III nitride forming the n-type layer 1. As such acceptor element, B (boron) may be used, for example.

The p-type layer 2 is preferably formed to have a hole density of $1 \times 10^{19}/cm^3$ or higher at least in the vicinity of the junction 3. With such composition, the p-type layer 2 has low resistivity in itself, and further, a contact resistance between the p-type layer 2 and anode electrode 5 can also be reduced. In addition, the depletion layer can be prevented from extending into the p-type layer 2 during reverse blocking, allowing the p-type layer 2 to be formed thin. Under these reasons, a series resistance in the p-type layer 2 at forward conduction can be reduced.

For instance, forming the p-type layer 2 to contain an acceptor element such as B at a density of $1 \times 10^{20}/cm^3$ or higher can easily achieve the aforementioned hole density.

The group-IV semiconductor material may be $Si_{1-z}Ge_z$ ($0 \leq z \leq 1$), for example. This can achieve the positional relationship between valence band and conduction band at the junction 3 as shown in FIG. 1B and the aforementioned hole density. Among all, the use of Si is a preferable example. In such case, Si may be polycrystalline. Such p-type layer 2 is obtained by depositing in a thickness not more than submicron order to several microns on the n-type layer 1 by using known various physical and chemical vapor deposition techniques such as CVD, sputtering, and vapor deposition.

In the semiconductor device 10 shown in FIG. 1A, the junction 3 is created by providing the n-type layer 1 and p-type layer 2 to be in contact at the whole end face of each other, which, however, is not an essential configuration. For instance, the junction 3 may be formed by joining the p-type layer 2 only to a partial region of an end face of the n-type layer 1. While illustration is omitted, the main surface of the n-type layer 1 may be formed to be square, and the p-type layer 2 and anode electrode 5 may be formed like a disc or cylinder on that main surface, more specifically, may be grown perpendicularly to that main surface with their central axes passing through the center of gravity of the square and have a circular shape in cross section. Such p-type layer 2 may be formed by a known photolithography or CVD technique.

Since SiC is not used for semiconductor layers in the semiconductor device 10, the problem of manufacturing yields resulting from the presence of micropipes does not arise. In addition, since substantial carriers are electrons only, carrier recombination essentially resulting from crystal defects does not occur. Therefore, the semiconductor device 10 is characterized in that the output current is less likely to be limited.

In the whole n-type layer 1, the group-III nitride does not need to have a uniform composition, but may have a gradient composition or a plurality of layers of different compositions. Preferably, a group-III nitride having a composition of y=0, that is, $Al_{1-x}Ga_xN$ ($0 \leq x \leq 1$) is used at least in the vicinity of the junction 3. In such case, the condition as shown in FIG. 1B in which the energy level at the top of the valence band of the n-type layer 1 is lower than the energy level at the top of the valence band of the p-type layer 2 is more likely to be achieved, which advantageously easily allows substantial carriers to be limited to electrons only.

The cathode electrode 4 may be made of Ti/Al, for example. The anode electrode 5 may be made of Al, for example. These electrodes may be formed by a known technique such as vacuum vapor deposition.

According to the present embodiment as described above, in a P-N junction semiconductor device, forming an n-type layer of a group-III nitride having a composition of $Al_{1-x-y}Ga_xIn_yN$ ($x \geq 0$, $y \geq 0$, $0 \leq x+y \leq 1$) and forming a p-type layer of a group-IV semiconductor material having a smaller band gap than the group-III nitride provides a semiconductor device satisfying the requirements of: (1) small leakage current during reverse blocking; (2) high breakdown voltage during reverse blocking; (3) large output current at forward conduction; (4) short reverse recovery time at shutoff; and further, (5) high peak surge current value.

Second Preferred Embodiment

A more specific embodiment of a semiconductor device based on the conceptual structure described in the first preferred embodiment will now be described as a second preferred embodiment. FIG. 2 is a sectional view schematically showing the structure of a semiconductor device 20 according to the present embodiment. Among components of the semiconductor device 20 shown in FIG. 2, those achieving similar effects as those of the semiconductor device 10 are indicated by the same reference characters as in FIG. 1 and repeated explanation will be omitted.

The semiconductor device 20 shown in FIG. 2 features including a third electrode 6 not provided for the semiconductor device 10. The third electrode 6 is an electrode provided over the surfaces of the anode electrode 5 and n-type layer 1, and creates a Schottky junction with the n-type layer 1 at a junction 7 adjacent to the junction 3. In other words, the third electrode 6 covers the p-type layer 2 and anode electrode 5 deposited on the n-type layer 1. Accordingly, in the semiconductor device 20, the third electrode 6 and anode electrode 5 are connected in parallel, and the third electrode 6 also serves as an anode electrode. Such third electrode 6 may be made of Ni, for example. In this case, a known technique such as vacuum vapor deposition may be used.

The semiconductor device 20 provided with such third electrode 6 presents a combined structure of P-N junction and Schottky junction. Accordingly, current flows through the Schottky junction at low voltage conduction, while current induced by carrier injection flows through the P-N junction at high voltage conduction. The former contributes to decrease in voltage at the rising edge of current, and the latter contributes to ensure the operation with low on-state voltage.

During reverse blocking, current is blocked at the P-N junction, which ensures a high breakdown voltage.

According to the present embodiment as described above, forming a semiconductor device with the combined structure of P-N junction and Schottky junction by additionally providing the P-N junction semiconductor device according to the first preferred embodiment with an anode electrode creating a Schottky contact with an n-type layer achieves effects resulting from the Schottky junction in addition to the effects obtained by the P-N junction semiconductor device according to the first preferred embodiment. Therefore, a semiconductor device with more excellent properties can be obtained.

Variant

Figure 3:
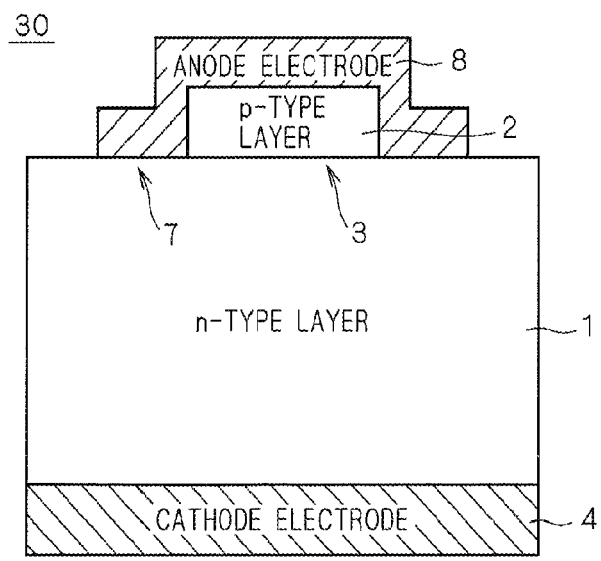
FIG. 3 is a sectional view illustrating a semiconductor device according to a variant.

While the third electrode 6 is provided in addition to the anode electrode 5 in the second preferred embodiment, a single anode electrode may fulfill the both roles. FIG. 3 is a sectional view illustrating a semiconductor device 30 according to this variant. In the semiconductor device 30 shown in FIG. 3, an anode electrode 8 is provided to fulfill such roles. In this case, the effects similar to those in the second preferred embodiment are also achieved.

EXAMPLES

First Example

In this example, a P-N junction vertical diode 110 which is one of specific embodiments of the semiconductor device 10 was prepared, and its properties were evaluated. FIG. 4A is a top view of the vertical diode 110, and FIG. 4B is a sectional view.

First, an n-type GaN substrate 1a having a thickness of 300 μm and an electron density of $1 \times 10^{18}/cm^3$ was prepared. A GaN film 1b having an electron density of $1 \times 10^{16}/cm^3$ was deposited thereon in a thickness of 5 μm by MOCVD to obtain the n-type layer 1.

Next, by ion implantation of Mg into part of the surface of the GaN film 1b and subsequent heat treatment for activating Mg, a field limiting ring 9 made of p-type GaN having a hole density of $1 \times 10^{18}/cm^3$ was formed.

Subsequently, a Si layer doped with boron as an acceptor element of about $2 \times 10^{20}/cm^3$ so as to have a hole density of $1 \times 10^{19}/cm^3$ or higher was formed as the p-type layer 2 on the n-type layer 1 (specifically, on the GaN film 1b) in the form of a disc having a diameter of 1 mm and a thickness of 0.5 μm by photolithography and low-pressure CVD techniques.

Further, a metal layer made of Ti/Al was deposited on the rear surface of the GaN substrate 1a (opposite to the Si-layer-formed surface), and a metal layer made of Al was deposited on the surface of the Si layer by vacuum vapor deposition, respectively. An alloy layer was then formed at a metal-semiconductor interface by heating in nitrogen. The cathode electrode 4 and anode electrode 5 were thereby obtained. An insulation protecting film made of SiN not shown was formed so as to expose a metal electrode only.

Finally, dicing was conducted such that each chip has a 2 μm×2 μm square shape in plan view with the center of the Si layer aligned with the center of each chip, and each obtained chip was packaged in a predetermined package to obtain the vertical diode 110.

Thus manufactured vertical diode 110 was measured in leakage current during reverse blocking, reverse blocking breakdown voltage (dielectric breakdown voltage), forward output current, reverse recovery time, peak surge current, on-state voltage at a forward current of 20A and on-state voltage at a forward current of 1A.

Second Example

In this example, a P-N junction vertical diode 120 corresponding to a specific embodiment of the semiconductor device 30 which is a variant of the semiconductor device 20 was prepared, and its properties were evaluated. FIG. 5A is a top view of the vertical diode 120, and FIG. 5B is a sectional view.

In this example, the processes up to formation of the Si layer were carried out similarly to the first example. Further, formation of the anode electrode 4 on the rear surface of the GaN substrate 1a was also carried out similarly to the first example.

A metal layer made of Ni was formed as the anode electrode 8 on the Si layer in the form of a disc having a diameter of 1 mm in plan view to cover the whole surface of the Si layer.

Formation of the insulation protecting film and packaging were also carried out similarly to the first example. The vertical diode 120 was thereby obtained.

Measurements were conducted on the manufactured vertical diode 120 similarly to the first example.

Comparative Example

Figure 6A:
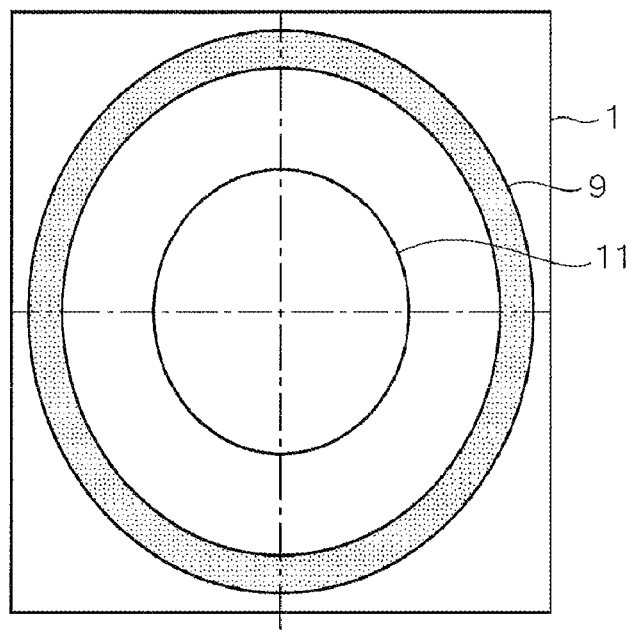
FIGS. 6A and 6B are diagrams schematically showing the structure of a vertical diode according to the variant.
Figure 6B:
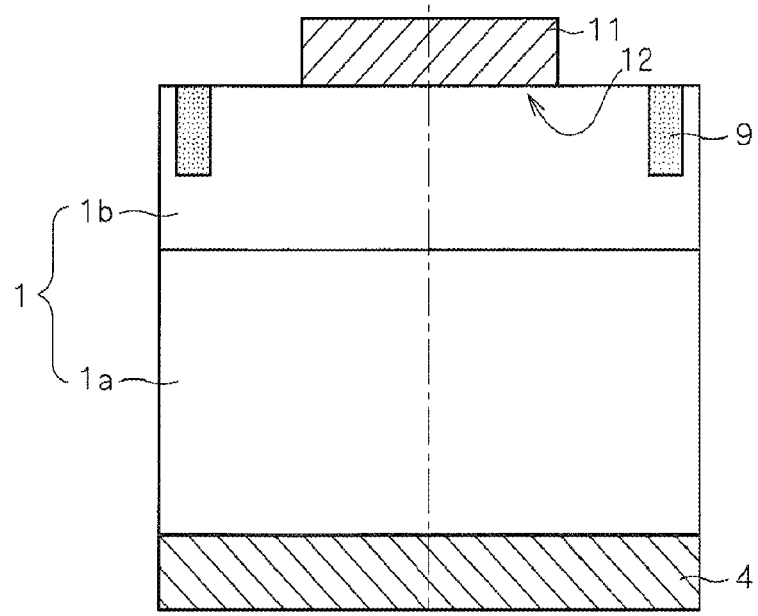

As a comparative example, a Schottky-junction vertical diode 200 was prepared using the same n-type layer 1 as in the examples, and its properties were evaluated. FIG. 6A is a top view of the vertical diode 200, and FIG. 6B is a sectional view.

In this example, the n-type layer 1, field limiting ring 9 and cathode electrode 4 were formed similarly to the first example.

A metal layer made of Ni was formed as an anode electrode 11 on the n-type layer 1 in the form of a disc having a diameter of 1 mm in plan view by vacuum vapor deposition.

Formation of the insulation protecting film and packaging were also carried out similarly to the first example. The Schottky-junction vertical diode 200 was thereby obtained.

Measurements were conducted on the manufactured Schottky junction vertical diode 200 similarly to the first example.

Comparison Between Examples and Comparative Example

FIG. 7 is a table listing leakage current during reverse blocking, reverse blocking breakdown voltage (dielectric breakdown voltage), forward output current, reverse recovery time, peak surge current, on-state voltage at a forward current of 20A and on-state voltage at a forward current of 1A, each measured in the first example, second example and comparative example, respectively.

As understood from FIG. 7, either the first or second example shows the results of small leakage current and high breakdown voltage during reverse blocking, large output current at forward conduction, high peak surge current value, and in addition, a reverse recovery time of 0 which has been difficult to achieve in conventional P-N junction devices.

Further, the on-state voltage at a forward current of 20A in either example is lower than the comparative example, while the on-state voltage at a forward current of 1A in the second example is substantially equal to that of the comparative example. The former result means that the operation of the P-N junction vertical diodes 110 and 120 is ensured at low on-state voltage, while the latter indicates that the vertical diode 120 according to the second example has a Schottky junction.

While the invention has been shown and described in detail, the foregoing description is in all aspects illustrative and not restrictive. It is therefore understood that numerous modifications and variations can be devised without departing from the scope of the invention.

What is claimed:

1. A semiconductor device comprising:
a first semiconductor layer having n-type conductivity;
a second semiconductor layer joined to said first semiconductor layer at a first junction, said semiconductor layer having p-type conductivity;
a cathode electrode joined to said first semiconductor layer;
an anode electrode joined to said second semiconductor layer and covering an upper surface of said second semiconductor layer, said anode electrode and said second semiconductor layer having coincident side surface boundaries;
a third electrode joined to said first semiconductor layer at a second junction, said third electrode having a Schottky contact property to said first semiconductor layer,
wherein
said first semiconductor layer is made of a group-III nitride having a composition of $Al_{1-x-y}Ga_xIn_yN$ ($x \geq 0$, $y \geq 0$, $0 \leq x+y \leq 1$),
said second semiconductor layer is made of a group-IV semiconductor material having a smaller band gap than said group-III nitride,
an energy level at a top of a valence band of said first semiconductor layer is lower than an energy level at a top of a valence band of said second semiconductor layer in the vicinity of said first junction, and
said anode electrode and said third electrode are connected in parallel,
wherein said second semiconductor layer is deposited on a partial region of a main surface of said first semiconductor layer to create said first junction, and
said third electrode is formed directly on and covers an upper surface and side surfaces of said anode electrode, side surfaces of said second semiconductor layer, and a portion of an upper surface of said first semiconductor layer adjoining said second semiconductor layer to create said second junction adjacent to said first junction.

2. The semiconductor device according to claim 1, wherein said group-III nitride has a composition of $Al_{1-x}Ga_xN$ ($0 \leq x \leq 1$) at least in the vicinity of said first junction of said first semiconductor layer.

3. The semiconductor device according to claim 1, wherein a hole density is $1 \times 10^{19}/cm^3$ or higher at least in the vicinity of said first junction of said second semiconductor layer.

4. The semiconductor device according to claim 1, wherein an acceptor density is $1 \times 10^{20}/cm^3$ or higher at least in the vicinity of said first junction of said second semiconductor layer.

5. The semiconductor device according to claim 4, wherein said group-IV semiconductor material is $Si_{1-z}Ge_z$ ($0 \leq z \leq 1$) at least in the vicinity of said first junction of said second semiconductor layer.

6. The semiconductor device according to claim 5, wherein said group-IV semiconductor material is Si at least in the vicinity of said first junction of said second semiconductor layer.

* * * * *